United States Patent
Losehand et al.

[11] Patent Number: 6,060,757
[45] Date of Patent: May 9, 2000

[54] HIGH FREQUENCY RF DIODE WITH LOW PARASITIC CAPACITANCE

[75] Inventors: Reinhard Losehand; Hubert Werthmann, both of Munich, Germany

[73] Assignee: Siemens Aktiengesellschaft, Munich, Germany

[21] Appl. No.: 09/140,962

[22] Filed: Aug. 27, 1998

[30] Foreign Application Priority Data

Aug. 27, 1997 [DE] Germany .......................... 197 37 360

[51] Int. Cl.⁷ .................................................. H01L 29/47
[52] U.S. Cl. ........................................... 257/471; 257/485
[58] Field of Search ..................... 257/471–486

[56] References Cited

U.S. PATENT DOCUMENTS

| | | | |
|---|---|---|---|
| 3,780,320 | 12/1973 | Dorler et al. | 257/476 |
| 4,888,623 | 12/1989 | Enomoto et al. | 257/476 |
| 5,021,840 | 6/1991 | Morris | 257/476 |
| 5,258,640 | 11/1993 | Hsieh et al. | 257/471 |
| 5,438,218 | 8/1995 | Nakamura et al. | 257/476 |

OTHER PUBLICATIONS

Microwave Semiconductors –short Form Catalog 1988/1989.
Lehrbuch der Hochfrequenztechnik, 1987.

*Primary Examiner*—David Hardy
*Attorney, Agent, or Firm*—Hill & Simpson

[57] ABSTRACT

An RF diode, and method for its manufacture, in which a well, doped n-conductive or p-conductive, is formed in a high-ohmic silicon substrate. A silicon epitaxial layer is provided over a first subregion of a surface of the well wherein the layer has the same conductivity type as the doped well. The silicon epitaxial layer is provided with a first Schottky contact layer onto which a first contact metallization is applied. A second subregion located next to the first subregion of the surface of the well is provided with a second Schottky contact layer onto which a second contact metallization is applied.

5 Claims, 6 Drawing Sheets

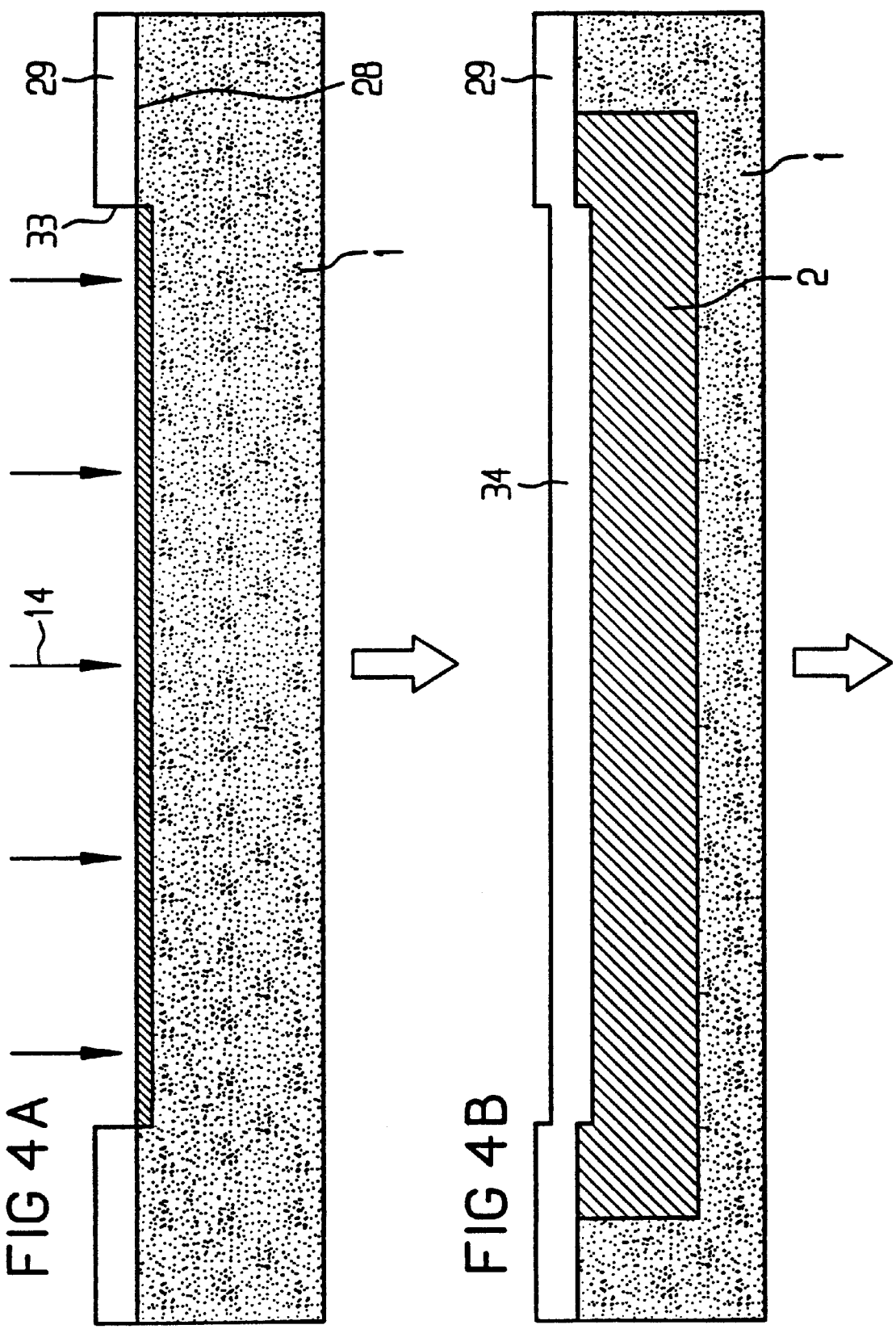

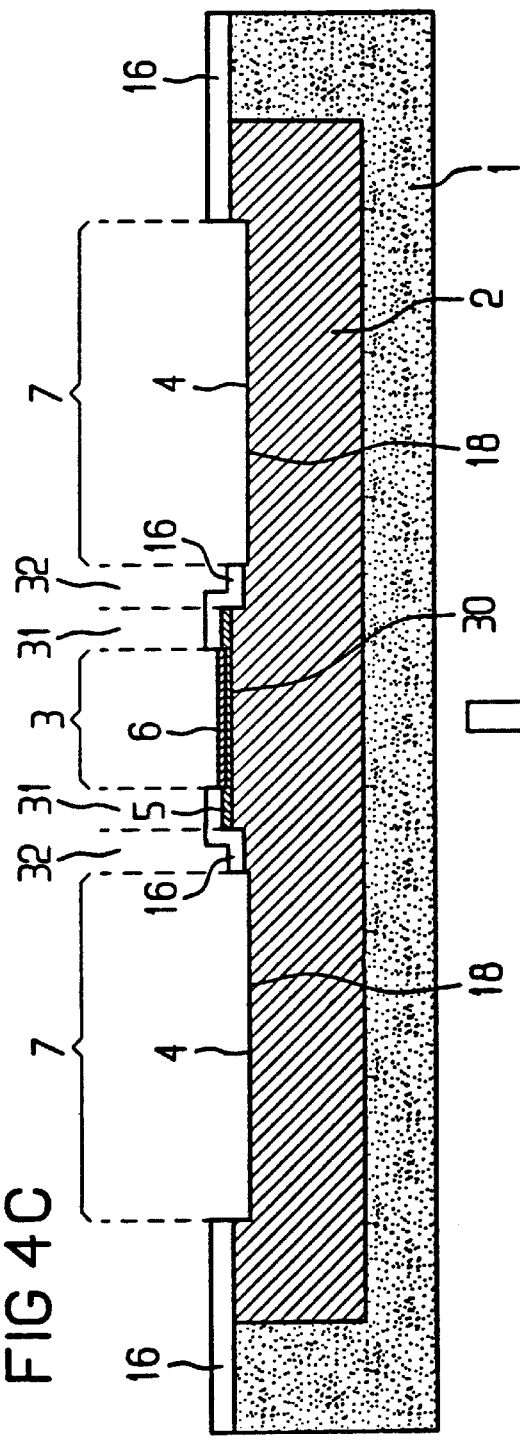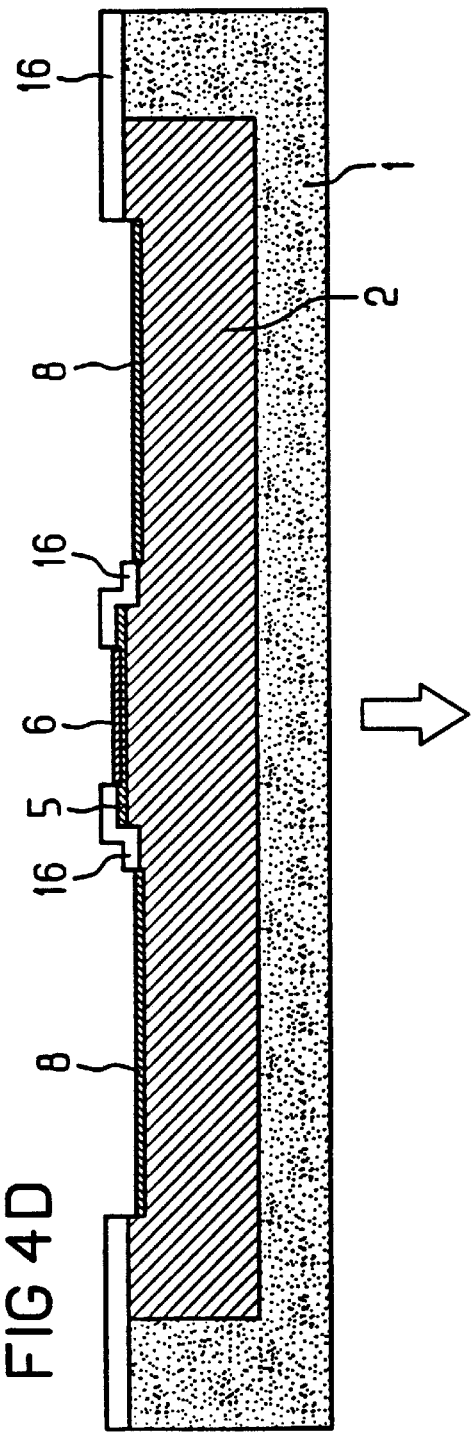

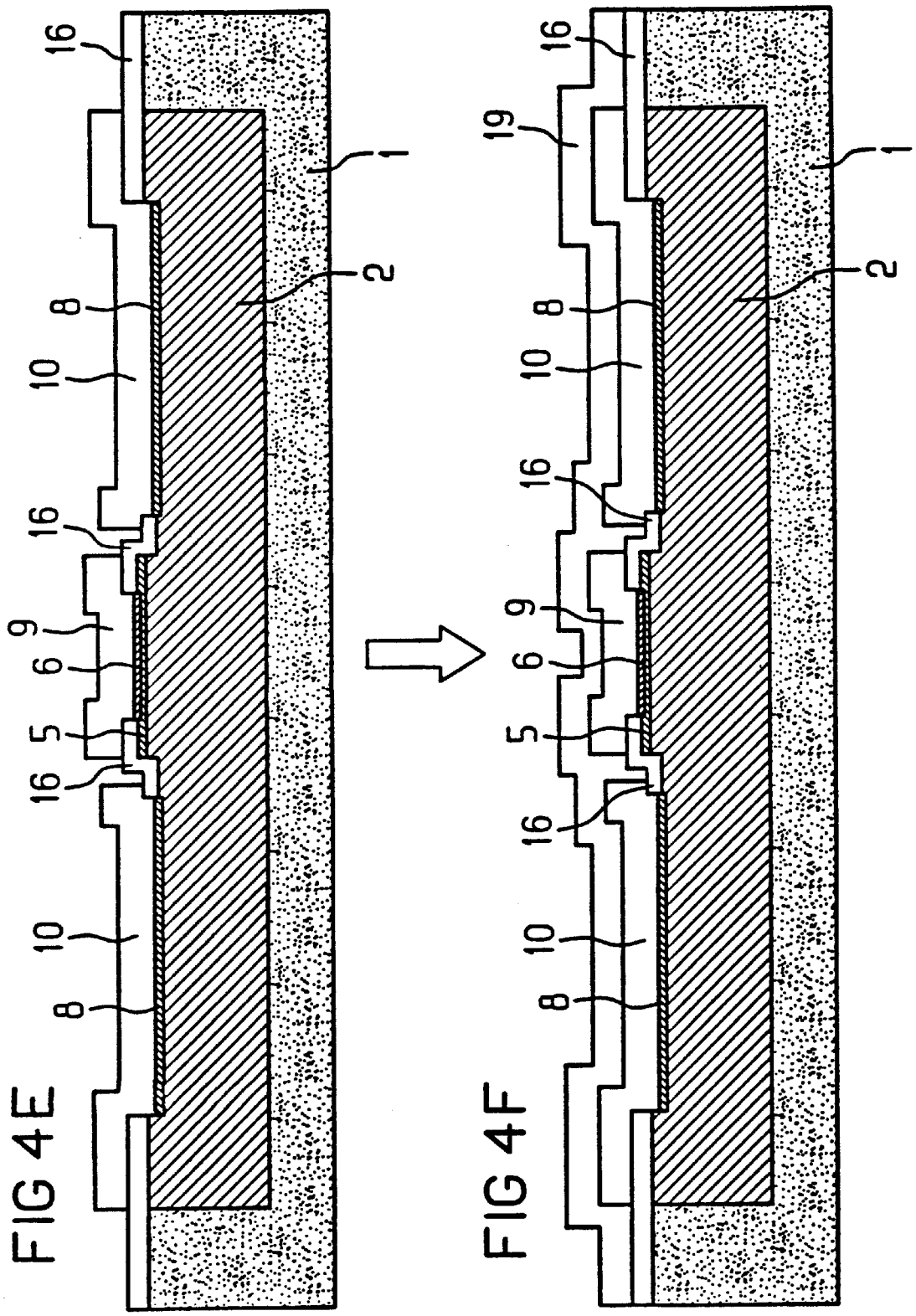

HIGH FREQUENCY RF DIODE WITH LOW PARASITIC CAPACITANCE

BACKGROUND OF THE INVENTION

1. Field of the Invention

The present invention relates to an RF diode and, in particular, to an RF diode for use at frequencies above 20 GHz and having a parasitic capacitance of less than 50 fF.

2. Description of the Prior Art

Until now, RF diodes have been manufactured using beam lead technology, in which a sintered glass layer is arranged between a silicon substrate and a contact metallization toward the diode structure. Such diodes are known from Zinke/Brunswig, Lehrbuch der Hochfrequenztechnik, $3^{rd}$ ed., $2^{nd}$ vol., Springer-Verlag, Berlin, 1987, p. 58, or from Microwave Semiconductors, Short Form Catalog 1988/89, pages 10 and 11. This type of RF diode is thus connected with a large manufacturing outlay. In addition, the assembly of these RF diodes cannot be carried out using conventional automatic placement machines used in semiconductor microelectronics.

An object of the present invention is to develop RF diodes with a parasitic capacitance of less than 50 fF that require a low manufacturing outlay and that can be assembled using conventional automated placement machines used in semiconductor technology.

SUMMARY OF THE INVENTION

Such object is achieved in an RF diode, and method of manufacturing the same, in accordance with the teachings of the present invention wherein it is provided that a well that is doped n-conductive or p-conductive is formed in a high-ohmic silicon substrate whose specific resistance is preferably greater than 3 K $\Omega$cm. On a first subregion of the side of the well facing away from the silicon substrate, a silicon epitaxial layer is applied to this side. Such layer has the same conductivity type as the doped well but preferably has a lower content of doping material than does the well.

The silicon epitaxial layer is provided with a first Schottky contact layer. A second Schottky contact layer is applied on a second subregion located next to the first subregion, of the side of the well facing away from the silicon substrate. In addition, the first and the second Schottky contact layers are provided with a first or, respectively, with a second contact metallization.

The high-ohmic silicon substrate acts as a dielectric at frequencies above 20 GHz and, thus, possesses the desired low parasitic capacitance. The conductively doped well ensures a low series resistance and, thus, low electrical losses of the RF diode. In addition, the RF diode of the present invention can be formed easily, in a flip-chip manner, by means of manufacturing methods conventionally used in semiconductor technology. For the equipping of the RF diodes, conventional automated placement machines can be used.

Preferably, the silicon epitaxial layer is not covered entirely by the first Schottky contact layer, but rather only except for a narrow frame-shaped edge region. Likewise, the second Schottky contact layer is preferably applied to the well in such a way that a narrow frame remains free around the silicon epitaxial layer. This annular surface region, not covered by the Schottky contact layers, of the well and of the silicon epitaxial layer between the first and the second Schottky contact layer is preferably covered with an electrical insulating layer. This frame-shaped insulating layer defines the effective surface of the RF diode.

In an alternative embodiment, in a top view of the well, the effective diode surface essentially has the shape of a circular disk that is arranged inside an essentially circular-disk-shaped window of the second Schottky contact layer.

The conductively doped well is preferably doped with arsenic, whereby the charge bearer concentration is approximately $5-6*10^{19}$ cm$^{-3}$. The silicon epitaxial layer is preferably doped with phosphorus, 0.15 to 0.20 $\mu$m thick, and contains, for example, a charge bearer concentration of approximately $1.5*10^{17}$ cm$^{-3}$.

In a preferred method for manufacturing the inventive RF diode, first the doped well is manufactured in a high-ohmic silicon substrate; for example, by means of implantation of a doping material, e.g. arsenic, through a window of an oxide layer, and subsequent diffusion out of the doping material. The oxide layer is, for example, manufactured by means of oxidization and the window is manufactured by means of phototechnology and subsequent oxide etching. An oxide layer that arises on the substrate and on the well during the diffusion out is subsequently removed again.

Thereafter, a doped silicon epitaxial layer is applied at least to the first subregion of the surface of the well which is then structured, if required, by means of phototechnology. Subsequently, the electrical insulating layer is applied to the silicon substrate, the surface of the well and the silicon epitaxial layer. It is then structured in such a way that the first subregion and the second subregion are exposed for the first Schottky contact layer or, respectively, the second Schottky contact layer.

After the first subregion and the second subregion are provided with a first or, respectively, with a second metal layer, there occurs a siliconizing step for the manufacture of the Schottky contact layers. Following this, non-siliconized regions of the metal layers are removed again, for example by means of selective etching, before a first or, respectively, second contact metallization is applied to the first and the second Schottky contact layer.

Additional features and advantages of the present invention are described in, and will be apparent from, the Detailed Description of the Preferred Embodiments and the Drawings.

DESCRIPTION OF THE DRAWINGS

FIGS. 4a to 4f show a schematic view of the method sequence for the manufacture of a preferred embodiment of the RF diode of the present invention.

DETAILED DESCRIPTION OF THE PREFERRED EMBODIMENTS

Figure 1:
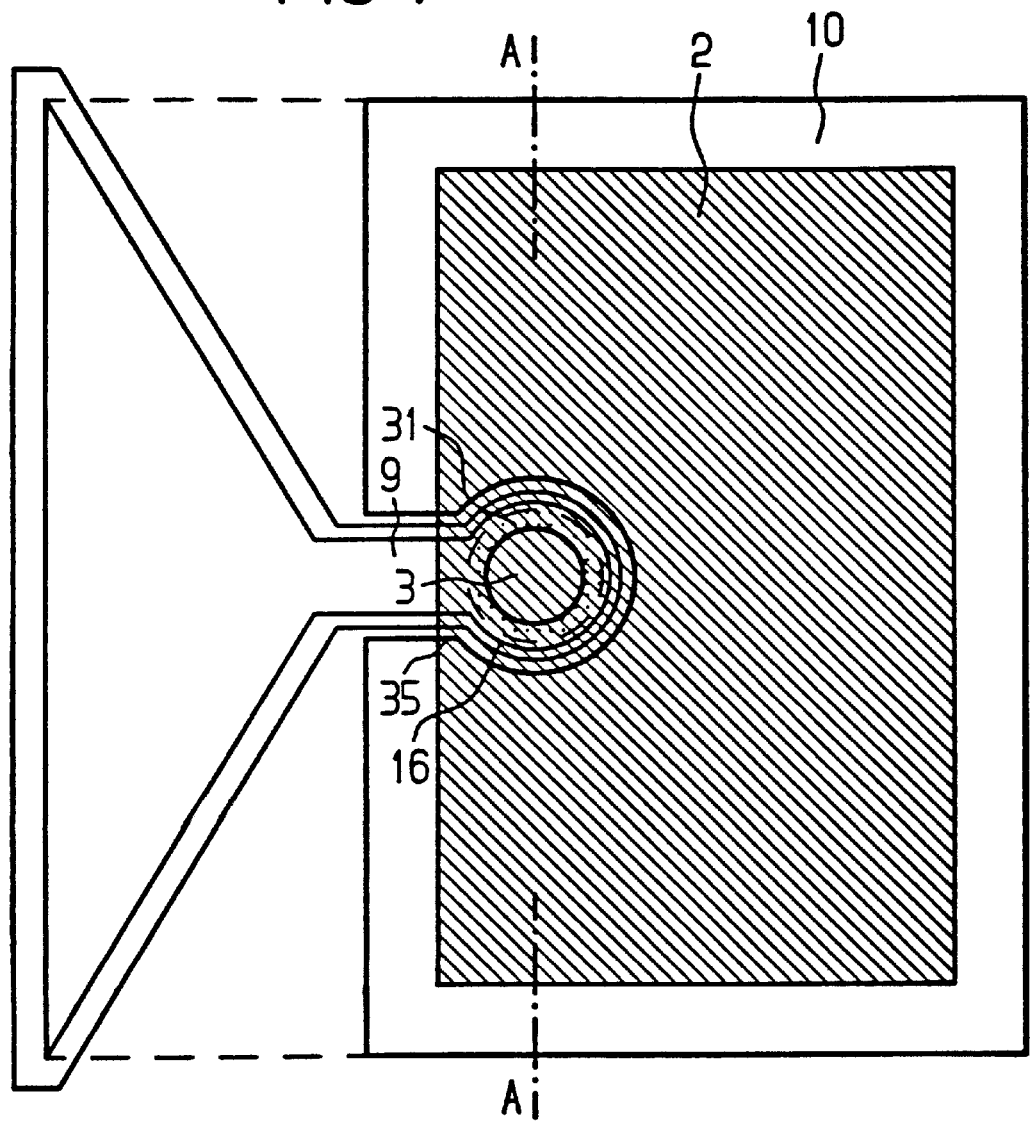
FIG. 1 shows a schematic top view of a preferred embodiment of the present invention.
Figure 2:
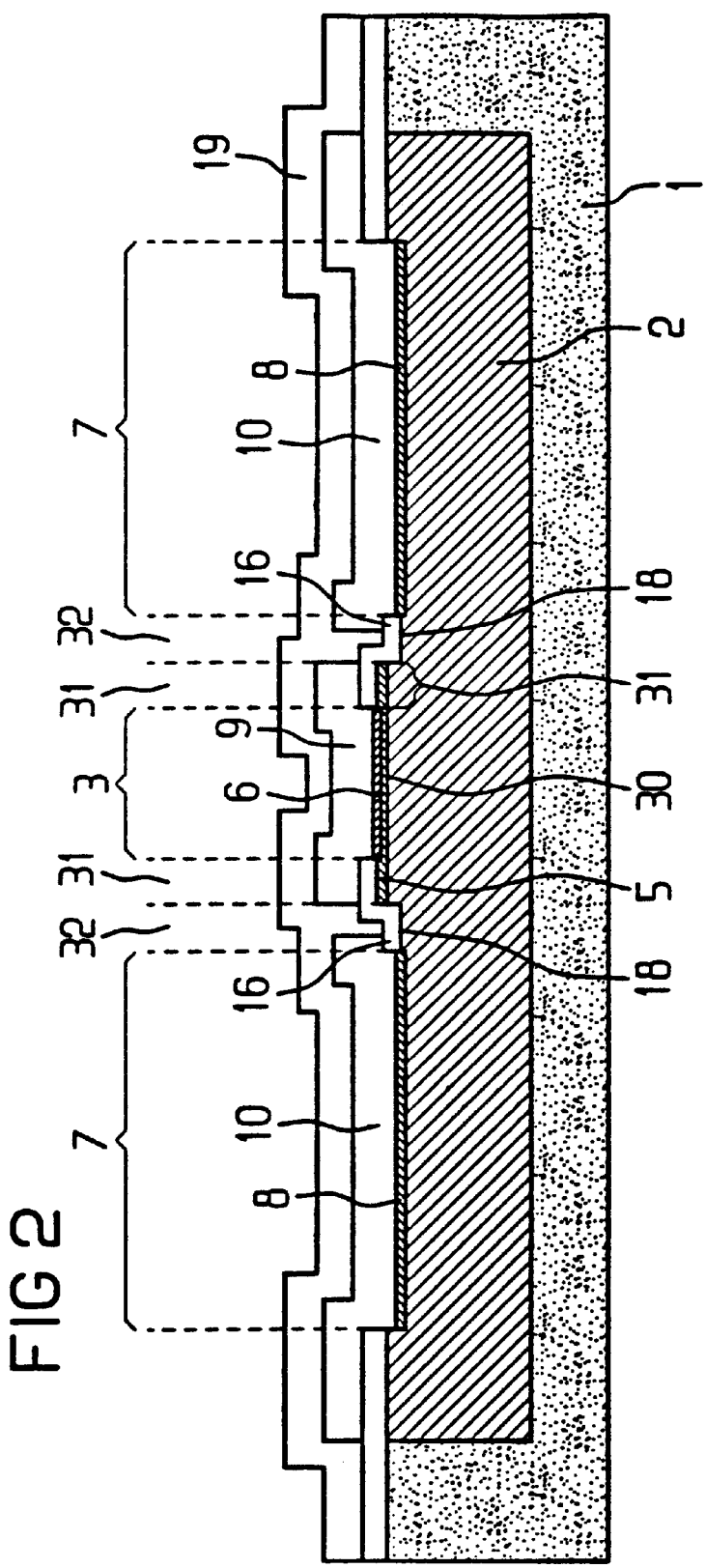
FIG. 2 shows a schematic view of a section through the preferred embodiment, along the line A—A drawn in FIG. 1.

In the embodiments of FIGS. 1 and 2, a conductively doped well 2 is formed in a high-ohmic silicon substrate 1. The substrate is, for example, doped with boron, is 100-oriented, and is provided with a doping material concentration of $3*10^{12}$ cm$^{-3}$. The well 2 is, for example, doped with arsenic and has a doping material content of $5-6*10^{19}$ cm$^{-3}$.

In the well 2, a recess 18 is formed which, on the side of the well facing away from the silicon substrate 1, limits an island-type raised part 30 with a web 35 leading from this raised area to the edge of the well. On the main surface of the island-type raised area 30 of the well 2, a silicon epitaxial layer 5 is applied which is, for example, doped with phosphorus (doping material content e.g. $1.5*10^{17}$ cm$^{-3}$) and has a thickness between 0.15 and 0.20 µm.

A first Schottky contact layer 6 is located on an essentially circular-disk-shaped diode region 3 of the silicon epitaxial layer 5, whereby a narrow frame 31 of the silicon epitaxial layer 5 is left exposed around the first Schottky contact 6.

The entire floor surface of the recess 18 is covered by a second Schottky contact layer 8, except for a narrow edge region 32, toward the diode region 3. This is what is called the substrate contact region 7. The region of the surface of the well 2 and of the silicon epitaxial layer 5 not covered by the Schottky contact layers 6, 8, includes the narrow frame 31 of the silicon epitaxial layer 5 around the first Schottky contact 6 and the narrow edge region 32 of the recess toward the diode region 3, as well as the remaining surface of the well 2, lying outside the recess 18. Such region, as well as the region of the silicon substrate 1, are covered with an electrical insulating layer 16. This insulating layer 16 thus defines contact windows for the Schottky contact layers 6, 8.

On the Schottky contact layers 6, 8, contact metallizations 9, 10 that are separated from one another are applied which include an overlap on the edges of the Schottky contact layers 6, 8 with the bordering electrical insulating layer 16. The free surfaces of the contact metallizations 9, 10, as well as of the electrical insulating layer 16, are covered with a passivation layer 19; for example, a plasma nitride layer.

Figure 3:
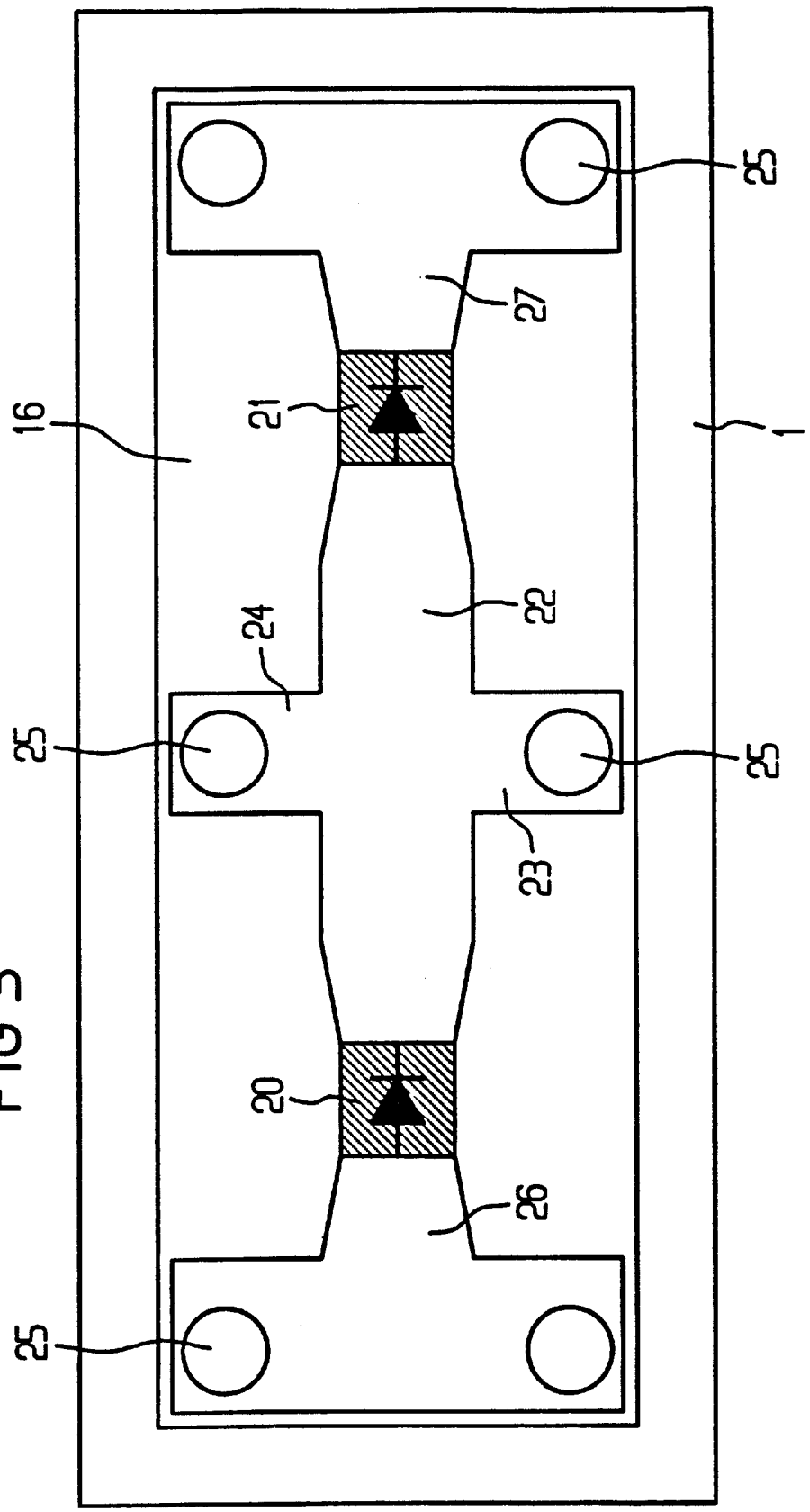
FIG. 3 shows a schematic representation of a top view of an RF diode chip with two RF diodes in accordance with the present invention.

In the RF diode chip of FIG. 3, two RF diodes are connected in series according to the embodiment of FIGS. 1 and 2. On a silicon substrate 1, two diode structures 20, 21 are positioned at a distance from one another in such a way that the anode terminal of the second RF diode 21 and the cathode terminal of the first RF diode 20 are facing one another. The cathode terminal of the first RF diode 20 is connected with the anode terminal of the second RF diode 21 via an interconnect 22 made, for example, of gold. In the center between the two RF diodes 20, 21, the interconnect 22 has terminal branchings 23, 24 on which are located raised terminal regions 25; e.g., in the form of gold bumps with a height of 10 µm. Likewise, the anode contact of the first RF diode 20 and the cathode contact of the second RF diode 21 are respectively connected in electrically conductive fashion with two raised terminal areas 25 via a respective interconnect 26, 27. The interconnects 22, 23, 24, 26, 27, as well as the diode structures, are covered completely with the passivation layer 19. Only the raised terminal areas 25 protrude from this layer.

In the method sequence shown schematically in FIGS. 4a to 4f for the manufacture of the RF diode according to the preferred embodiment, an oxide layer 29 is first fashioned on a main surface 28 of a high-ohmic silicon substrate 1, e.g. boron-doped (doping material content approx. $3*10^{12}$ cm$^{-3}$) and 100-oriented. This oxide layer is subsequently provided with a window 33 by means of phototechnology and oxide etching—the window defining the shape of the well 2. Subsequently, an n-doping material, e.g. arsenic, is implanted 14 into the silicon substrate 1 through the window 33 (FIG. 4a).

Thereafter (FIG. 4b), the implantation is diffused out by means of tempering so that a conductively doped well 2 arises in the silicon substrate 1. This well 2 includes, for example, an arsenic content of approximately $5*10^{19}$ cm$^{-3}$. In this tempering step, there arises on the well 2 an oxide layer 34 that is subsequently removed by means of oxide etching, together with the oxide layer 29.

As a next step, a silicon epitaxial layer, e.g. doped n-conductively with phosphorus, is applied to the well 2, which layer is approximately 0.2 µm thick and has a doping material content of about $1.5*10^{17}$ cm$^{-3}$. Subsequently, the silicon epitaxial layer is structured, e.g. by means of phototechnology and silicon plasma etching, and the recess 18 is manufactured in such a way that only the raised area 30 is still provided with the silicon epitaxial layer 5; this area being limited by the recess 18. An edge region 32 of the recess toward the diode region 3 and a narrow frame of the raised area 30, as well as the remaining surface (lying outside the recess)of the tub 2 and of the silicon substrate 1 are provided with an electrical insulating layer 16. This layer is preferably manufactured by means of a low-temperature oxide deposition process in order to prevent a diffusion of the doping material of the well 2 into the silicon epitaxial layer 5. For this purpose, a low-temperature oxide layer is first deposited on the entire surface of the well 2 of the silicon epitaxial layer 5 in the diode region 3, with a thickness of approximately 0.6 µm, and is subsequently provided with the windows for the first and the second Schottky contact layers 6, 8, by means of phototechnology and oxide etching. The structure shown schematically in FIG. 4c, with oxide layer windows for the Schottky contact layers 6, 8, is thereafter present.

Next, a Schottky metal layer, e.g. Pd or Mo, is deposited on the free surfaces of the well 2 and of the silicon epitaxial layer 5 through the oxide layer window. Subsequently, this Schottky metal is siliconized by means of temperature treatment in the region of the oxide layer window. A non-siliconized residue of the Schottky metal layer is then removed again by means of selective etching so that in the diode region 3 and in the recess 18, a Schottky contact layer 6, 8 is respectively present on the silicon epitaxial layer 5 or, respectively, on the well 2 (FIG. 4d).

As a next step, contact metallizations 9, 10 separate from one another and are applied on the Schottky contact layers 6, 8, which respectively include an overlap with the insulating layer 16 adjacent to the Schottky contact layers 6, 8. The contact metallizations 9, 10 consist, for example, of a TiPtAu layer sequence (BELL contact)which first can be applied on the entire surface of the Schottky contact layers 6, 8 and of the insulating layer 16, and subsequently can be structured according to the desired shape of the contact metallizations 9, 10 using phototechnology. The corresponding structure is shown in FIG. 4e.

Finally, a passivation layer 19 is applied on the free surfaces of the contact metallizations 9, 10 and of the insulating layer 16; e.g., in the form of a plasma nitride layer (FIG. 4f).

The specification of the inventive RF diode on the basis of the embodiment described is, of course, not to be understood as a limitation of the invention thereto. For example, instead of the oxide layer 16, another electrical insulating layer known to those skilled in the art also can be used. Likewise, instead of the n-doping materials arsenic and phosphorus, other n-doping materials, or also p-doping materials, can be used for the conductively doped well 2 and the silicon epitaxial layer 5. Further, other Schottky contact layers and contact metallizations are also conceivable. Indeed, those of skill in the art will recognize that changes may be made thereto without departing from the spirit and scope of the invention as set forth in the hereafter appended claims.

We claim as our invention:

1. An RF diode, comprising:

a high-ohmic silicon substrate;

a well that is doped n-conductive or p-conductive, the well formed in the high-ohmic silicon substrate;

a silicon epitaxial layer formed only over a first subregion of a surface of the well, the layer having the same conductivity type as the well;

a first Schottky contact layer formed in the silicon epitaxial layer;

a second Schottky contact layer formed in a second subregion of the surface of the well which is located next to the first subregion, the second Schottky contact layer being in spaced adjacent relationship to both the silicon epitaxial layer and the first Schottky contact layer; and first and second contact metallizations formed on the first and second Schottky contact layers, respectively.

2. An RF diode as claimed in claim 1, wherein the silicon substrate has a specific resistance greater than 3 k $\Omega$cm.

3. An RF diode as claimed in claim 1, wherein the silicon epitaxial layer has a lower content of doping material than does the well.

4. An RF diode as claimed in claim 1, further comprising:

an electrical insulating layer arranged between the first and the second Schottky contact layers, the insulating layer covering an edge region of the surface of the well toward the silicon epitaxial layer, and covering a narrow region of the surface of the silicon epitaxial layer which runs around the first Schottky contact layer.

5. An RF diode as claimed in claim 1, wherein, in a top view of the well, the first subregion generally forms the shape of a circular disk that is arranged inside a substantially circular-disk-shaped opening in the second Schottky contact layer and, from the circular disk, a web that is electrically insulated against the well leads out from the well.

* * * * *